United States Patent
Dore et al.

(10) Patent No.: US 8,271,851 B2
(45) Date of Patent: Sep. 18, 2012

(54) ENCODING AND DECODING A DATA SIGNAL AS A FUNCTION OF A CORRECTING CODE

(75) Inventors: Jean-Baptiste Dore, Rennes (FR); Marie-Helene Hamon, Acigne (FR); Pierre Penard, Rennes (FR)

(73) Assignee: France Telecom, Paris (FR)

( * ) Notice: Subject to any disclaimer, the term of this patent is extended or adjusted under 35 U.S.C. 154(b) by 651 days.

(21) Appl. No.: 12/514,590

(22) PCT Filed: Nov. 9, 2007

(86) PCT No.: PCT/FR2007/052321
§ 371 (c)(1),
(2), (4) Date: May 13, 2009

(87) PCT Pub. No.: WO2008/059160
PCT Pub. Date: May 22, 2008

(65) Prior Publication Data
US 2010/0064195 A1    Mar. 11, 2010

(30) Foreign Application Priority Data
Nov. 13, 2006    (FR) ................................. 06 54864

(51) Int. Cl.
*H03M 13/00*    (2006.01)
(52) U.S. Cl. ................................................ 714/758
(58) Field of Classification Search ............... 714/755, 714/786, 790, 762, 788, 801, 758
See application file for complete search history.

(56) References Cited

U.S. PATENT DOCUMENTS

| | | | |
|---|---|---|---|
| 5,745,507 A * | 4/1998 | Chen | 714/763 |
| 7,178,080 B2 * | 2/2007 | Hocevar | 714/752 |
| 7,181,676 B2 * | 2/2007 | Hocevar | 714/780 |

(Continued)

FOREIGN PATENT DOCUMENTS
EP    1511177    3/2005
(Continued)

OTHER PUBLICATIONS

Sun, Yang et al., High Throughput, Parallel, Scalable LDPC Encoder/Decoder Architecture for OFDM Systems, Department of Electrical and Computer Engineering, Rice University, Houston, TX.

(Continued)

*Primary Examiner* — James C Kerveros
(74) *Attorney, Agent, or Firm* — Lowe Hauptman Ham & Berner, LLP

(57) ABSTRACT

The invention relates to correcting codes for encoding and decoding a data signal. A signal including data variables is coded into a signal including the data variables and parity variables. The encoding and decoding operations are based on a parity check matrix comprised of a systematic matrix and a parity matrix and having rows corresponding coefficients of parity equations and distributed into decoding windows of same size. In order to increase convergence of the iterative decoding, the elements of at least one column of the systematic matrix associated with a decoding window are "0s", except for a single element which is a "1". A data variable is only involved in one equation of the window and not involved in solving the equations of other windows as long as the solving of equations of the window is not achieved.

15 Claims, 11 Drawing Sheets

U.S. PATENT DOCUMENTS

| | | | |
|---|---|---|---|
| 7,584,400 B2 * | 9/2009 | Gray et al. | 714/755 |
| 7,653,859 B2 * | 1/2010 | Choi et al. | 714/755 |
| 7,917,827 B2 * | 3/2011 | Chung et al. | 714/752 |
| 7,996,746 B2 * | 8/2011 | Livshitz et al. | 714/758 |
| 2006/0015802 A1 | 1/2006 | Hocevar | |
| 2007/0022354 A1 * | 1/2007 | Yu et al. | 714/755 |

FOREIGN PATENT DOCUMENTS

| | | |
|---|---|---|
| EP | 1626505 | 2/2006 |
| EP | 1648091 | 4/2006 |

OTHER PUBLICATIONS

Wang, Zhongfeng et al., Area Efficient Decoding of Quasi-Cyclic Low Density Parity Check Codes, ICASSP, 2004, pp. V49-V52.

Mansour, Mohammad M., High-Performance Decoders for Regular and Irregular Repeat-Accumulate Codes, Department of Electrical and Computer Engineering, American University of Beirut, Beirut, Lebananon, IEEE Communications Society, Globecom, 2004, pp. 2583-2588.

Shanbao, He et al., Regular Lowe-Density Parity-Check Codes Based on Shifted Identity Matrices, "Journal of Electronics (China)," vol. 23, No. 1, Jan. 2006.

Radosavljevic, Predrag et al., High-Throughput Multi-Rate LDPC Decoder Based on Architecture-Oriented Parity Check Matrices, ECE Department, Rice University, Houston, TX 77005.

Karkooti, Marjan et al., Semi-Parallel Reconfigurable Architectures for Real-Time LDPC Decoding, Proceedings of the International Conference on Information Technology: Coding and Computing (ITCC'04).

Echard, Rich et al., The Pi-Rotation Low-Density Parity Check Codes, IEEE, 2001.

Mansour, Mohammad M. et al., Memory-Efficient Turbo Decoder Architectures for LDPC Codes, iCIMS Research Center, CSL, University of Illinois at Urbana-Champaign, Urbana, IL 61801, pp. 159-164.

Mansour, Mohammad M. et al., High-Throughput LDPC Decoders, IEEE, 2003.

Kienle, Frank et al., Design Methodology for IRA Codes, IEEE, 2004, pp. 459-462.

Fossorier, Mark, Quasi-Cyclic Low-Density Parity-Check Codes From Circulant Permutation Matrices, 0018-9448/04520.00, IEEE Transactions on Information Theory, vol. 50, No. 8, Aug. 2004, pp. 1788-1793.

Shimizu, Kazunori et al., Partially-Parallel LDPC Decoder Based on High-Efficiency Message Passing Algorithm, Waseda University, Kitakyushu-shi, Japan.

Jin, Hui et al., Irregular Repeat-Accumulate Codes, Department of Electrical Engineering, California Institute of Technology, Pasadena, CA 91125.

* cited by examiner

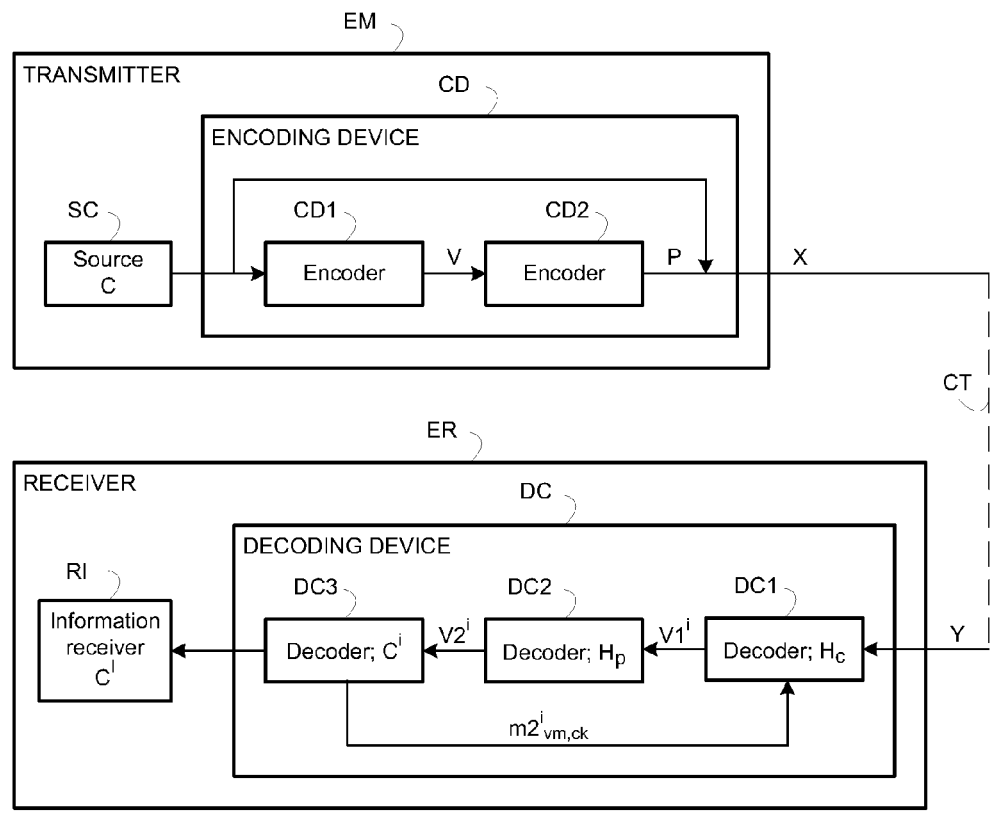

FIG. 2b $$H_c = \begin{bmatrix} I(1,1) & I(1,2) & -- & I(1,b) & -- & I(1,B) \\ I(2,1) & I(2,2) & -- & I(2,b) & -- & I(2,B) \\ | & | & & | & & | \\ I(a,1) & I(a,2) & -- & I(a,b) & -- & I(a,B) \\ | & | & & | & & | \\ I(A,1) & I(A,2) & -- & I(A,b) & -- & I(A,B) \end{bmatrix}$$

FIG. 2c $$H_p = \begin{bmatrix} I & 0 & --- & 0 & 0 & --- & I_p(1,B) \\ & I & & & & & \\ 0 & & & & & & 0 \\ & & & & & 0 & \\ & & & I & I & & \\ 0 & & & & 0 & & 0 \\ 0 & ----- & 0 & 0 & -0 & I & I \end{bmatrix}$$

FIG. 2d $$S = \begin{bmatrix} \delta(1,1) & \delta(1,2) & -- & \delta(1,b) & -- & \delta(1,B) \\ \delta(2,1) & \delta(2,2) & -- & \delta(2,b) & -- & \delta(2,B) \\ | & | & & | & & | \\ \delta(a,1) & \delta(a,2) & -- & \delta(a,b) & -- & \delta(a,B) \\ | & | & & | & & | \\ \delta(A,1) & \delta(A,2) & -- & \delta(A,b) & -- & \delta(A,B) \end{bmatrix}$$

FIG. 2e

ENCODING AND DECODING A DATA SIGNAL AS A FUNCTION OF A CORRECTING CODE

RELATED APPLICATIONS

The present application is based on, and claims priority from, FR Application Number 0654864, filed Nov. 13, 2006, and PCT Application Number PCT/FR07/052321, filed Nov. 9, 2007, the disclosures of which are hereby incorporated by reference herein in their entireties.

The present invention relates to correcting codes for encoding and decoding a data signal, in particular in the field of digital communication and the field of data storage.

More particularly, it relates to LDPC ("Low Density Parity Check") correcting codes in order to optimize the decoding of an encoded data signal.

Theses codes can in particular be implemented through different communication protocols such as IEEE 802.11n protocol intended for the very high bit rate Wireless Local Area Networks (WLAN) or even the IEEE 802.16 protocol (WIMAX ("World wide Interoperability Microwave Access") mobile).

The digital communication systems offering the best transmission qualities are currently those in which data are protected by a high performance channel coding and iteratively decoded by a weighted output decoder.

In the field of digital transmissions, and more particularly when the channel is of the radio-electric type, the main function of error correcting codes is to remove ambiguities delivered by the channel on a transmitted signal. The performance gain provided by these codes can be allocated to the reduction of terminal consumption, to the increase in the information volume being transmitted or even to a greater flexibility in the management of transmission cell size.

It is known that the Low Density Parity Check (LDPC) codes invented in 1960 par Gallager offer very high performances. They are constructed from a parity check matrix in order to obtain redundant bits, so-called parity bits, depending on data bits relating to the message to be transmitted. The data bits and the parity bits form a codeword included in the encoded signal to be transmitted.

In particular, the quasi-cyclic LDPC (QC LDPC) codes, the construction of which has been proposed in the document of Marc P. C. Fossorier, entitled "Quasi-cyclic Low-Density Parity-Check Codes From Circulant Permutation Matrices", IEEE Transaction on Information Theory, August 2004, consist of constructing the parity check matrix from identity sub-matrices, the columns of which are circularly permuted $\delta$ times leftwards or rightwards. This form of matrix enables an LDPC code to be simply parameterized and also enables the code decoding complexity to be reduced thanks to its quasi-cyclic structure.

The main drawback of this construction is the encoding difficulty.

To overcome this drawback, the construction proposed in the document of H. Jin, "Irregular repeat-accumulate codes", Proc. $2^{nd}$ Int Symp Turbo codes and related topics, Brest, France, September 2000, consists of dividing the parity check matrix H into two sub-matrices, a randomly generated matrix $H_1$ and a bidiagonal form matrix $H_2$ such that $H=[H_1 H_2]$. The parity bits are determined as a function of data bits according to the relationship:

$$p^T = H_2^{-1} H_1 C^T$$

with $p^T$ and $C^T$ being the respective transposes of the vector P containing the parity bits and the vector C containing the data bits.

The major drawback of this construction is the irregularity of the systematic part of the code represented by the random parity check matrix $H_1$, resulting in a non-optimum parallel decoding. These codes are called IRA ("Irregular Repeat-Accumulate") codes.

To overcome this drawback, Kazunori Shimizu et al. in their article "Partially-Parallel LDPC Decoder Based on High-Efficiency Message-Passing Algorithm", International Conference on Computer Design, San Jose, Calif., Oct. 2-5, 2005, pages 503-510, focus on the construction of a regular quasi-cyclic form parity check matrix from rules in order to implement a partially parallel decoding. However, restricting to a regular form of the parity check matrix makes encoding difficult. Moreover, the decoding algorithm relating to the parity check matrix is not optimal in terms of convergence quickness towards the results and useful resources causing multiple simultaneous memory accesses.

The article of Frank Kienle and Norbert Wehn, entitled "Design methodology for IRA codes", Proc. EDA Technofair Design Automation Conference Asia and South Pacific, 2004, describes a method for constructing IRA codes dedicated to a decoder architecture implementing a parallelization of the decoding tasks. In this article, the authors propose a fixed construction of the parity check matrix to avoid memory access conflicts typical of a parallel implementation of several processors. However, this construction of the correcting code does not ensure an optimum convergence of the decoding algorithm. Moreover, the decoder architecture and the parity check matrix as constructed only implement a parallel scheduling of the decoding tasks. Other types of scheduling or scheduling combinations are not considered.

The present invention overcomes the drawbacks discussed above by determining a code by means of a construction of a parity check matrix comprised of a systematic matrix and a parity matrix and the rows of which respectively correspond to coefficients of parity equations and are distributed in decoding windows of a same size, the rows of a same rank in the decoding windows being successive in the parity check matrix, characterized in that the elements of at least one column of the systematic matrix associated with a decoding window are "0s", except for a single one which is a "1".

The thus constructed systematic matrix enables a data variable to be only involved in one of the parity equations of a decoding window which provides a convergence quickness of the iterative decoding of encoded data signal and an optimum activity of a decoding device implementing said decoding and makes it easy to access to memories in the decoding device.

According to a first feature of determining a code for a serial type decoding of an encoded data signal, the systematic matrix comprises permuted identity matrices of a same size associated with permutation coefficients respectively, and the permutation coefficients associated with the identity matrices in a same column of the systematic matrix are different.

According to a second feature of code determining for a semi-parallel type decoding of an encoded data signal, the systematic matrix comprises permuted identity matrices of a same size associated with permutation coefficients respectively, the permutation coefficients associated with the identity matrices in a same column of the systematic matrix are different, and any two permutation coefficients in the same column have a difference different from 1 modulo the size of the identity matrices.

According to a third feature of code determining for an inter-decoder parallel type decoding of an encoded data signal, wherein the systematic matrix comprises permuted identity matrices of a same size associated with permutation coefficients respectively, the permutation coefficients associated with the identity matrices in a same column of the systematic matrix are different, any two permutation coefficients in said column have a difference different from 1 modulo the size of the identity matrices, and any two permutation coefficients in said column have a difference different from 2 modulo the size of the identity matrices.

According to a fourth feature of code determining for an intra-decoder parallel type decoding of an encoded data signal, the systematic matrix comprises permuted identity matrices of a same size associated with permutation coefficients respectively, and any two permutation coefficients associated with identity matrices in a same column of the systematic matrix have their difference different from $\beta$ z/h modulo z, where h is an integer submultiple of the size of the identity matrices z and $\beta$ is an integer lying between 1 and h.

According to a fifth feature of code determining, the systematic matrix further comprises null square matrices of a same size as the identity matrices, each column of the systematic matrix including at least one identity matrix.

The invention also relates to encoding and decoding depending on the determined code of a signal.

Encoding a signal including data variables into a signal including the data variables and parity variables, comprising solving parity equations the coefficients of which respectively correspond to the rows of a parity check matrix comprised of a systematic matrix and a parity matrix and which are distributed into decoding windows of a same size, the rows of a same rank in the decoding windows being successive in the parity check matrix, is characterized in that the elements of at least one column of the systematic matrix associated with a decoding window are "0s", except for a single one which is a "1".

Decoding a encoded data signal including data variables and parity variables, based on a parity check matrix comprised of a systematic matrix and a parity matrix and the rows of which respectively correspond to coefficients of parity equations and are distributed in decoding windows of a same size, the rows of a same rank in the decoding windows being successive in the parity check matrix, is characterized in that it comprises a simultaneous solving of the parity equations of at least one decoding window the elements of which in at least one column of the systematic matrix are "0s", except for a single one which is a "1", a data variable being only involved in one of the parity equations of the decoding window and not involved in the solving of parity equations of other decoding windows as long as the solving of the parity equations of the decoding window is not achieved.

According to a feature of the decoding of the invention, the data variables which are involved in the parity equations of the decoding window are each only involved in one of the parity equations of the decoding window, and are not involved in the solving of parity equations of other decoding windows as long as the solving of the parity equations of the decoding window is not achieved. This feature regarding the data variables involved in the parity equations of the decoding window increases the quickness of convergence of the iterative decoding.

An object of the invention is also to provide an encoding device and a decoding device to encode a data signal and decode an encoded data signal respectively.

The encoding device for encoding a signal including data variables into a signal including the data variables and parity variables, comprising an arrangement for solving parity equations the coefficients of which respectively correspond to the rows of a parity check matrix comprised of a systematic matrix and a parity matrix and which are distributed in decoding windows of a same size, the rows of a same rank in the decoding windows being successive in the parity check matrix, is characterized in that the elements of at least one column of the systematic matrix associated with a decoding window are "0s", except for a single one which is a "1".

The decoding device for decoding a encoded data signal including data variables and parity variables, based on a parity check matrix comprised of a systematic matrix and a parity matrix and the rows of which respectively correspond to coefficients of parity equations and which are distributed in decoding windows of a same size, the rows of a same rank in the decoding windows being successive in the parity check matrix, is characterized in that it comprises an arrangement for simultaneously solving parity equations of at least one decoding window whose elements in at least one column of the systematic matrix are "0s", except for a single one which is a "1", a data variable being only involved in one of the parity equations of the decoding window and not involved in solving the parity equations of other decoding windows as long as the solving of parity equations of the decoding window is not achieved.

In order to iteratively process all the decoding windows, the solving arrangement can comprise in order to execute each decoding iteration:

an arrangement for solving equations of the decoding window associated with the systematic matrix in order to determine first extrinsic variables as a function of the data variables and second extrinsic variables determined during the previous iteration, an arrangement for determining first intermediate variables depending on the systematic matrix and the first extrinsic variables being determined, an arrangement for solving parity equations of the decoding window associated with the parity matrix as a function of the first intermediate variables and the parity variables in order to obtain second intermediate variables, and an arrangement for solving the parity equations of the decoding window associated with the systematic matrix to determine second extrinsic variables as a function of the second intermediate variables and the first extrinsic variables, and at each decoding iteration, an arrangement for estimating other data variables as a function of the data variables of the encoded data signal and the determined second extrinsic variables during the processing of all the decoding windows.

Finally, the invention relates to computer programs being downloadable from a communication network and/or stored on a computer readable medium and/or executable by a processor. The programs comprise instructions for respectively implementing the encoding of a data signal and the decoding of an encoded data signal according to the invention.

Other features and advantages of the present invention will become more clearly apparent on reading the following description of several embodiments of the invention, given by way of nonlimiting example, with reference to the corresponding appended drawings, in which:

FIG. 1 is a schematic block diagram of a communication system according to the invention;

FIGS. 2a to 2e are schematic illustrations of a parity check matrix according to the invention and of matrices comprised therein;

Figure 11:
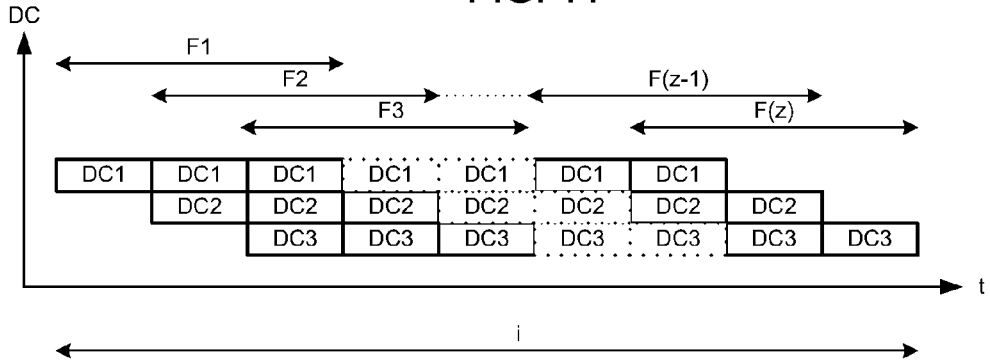
Figure 12:
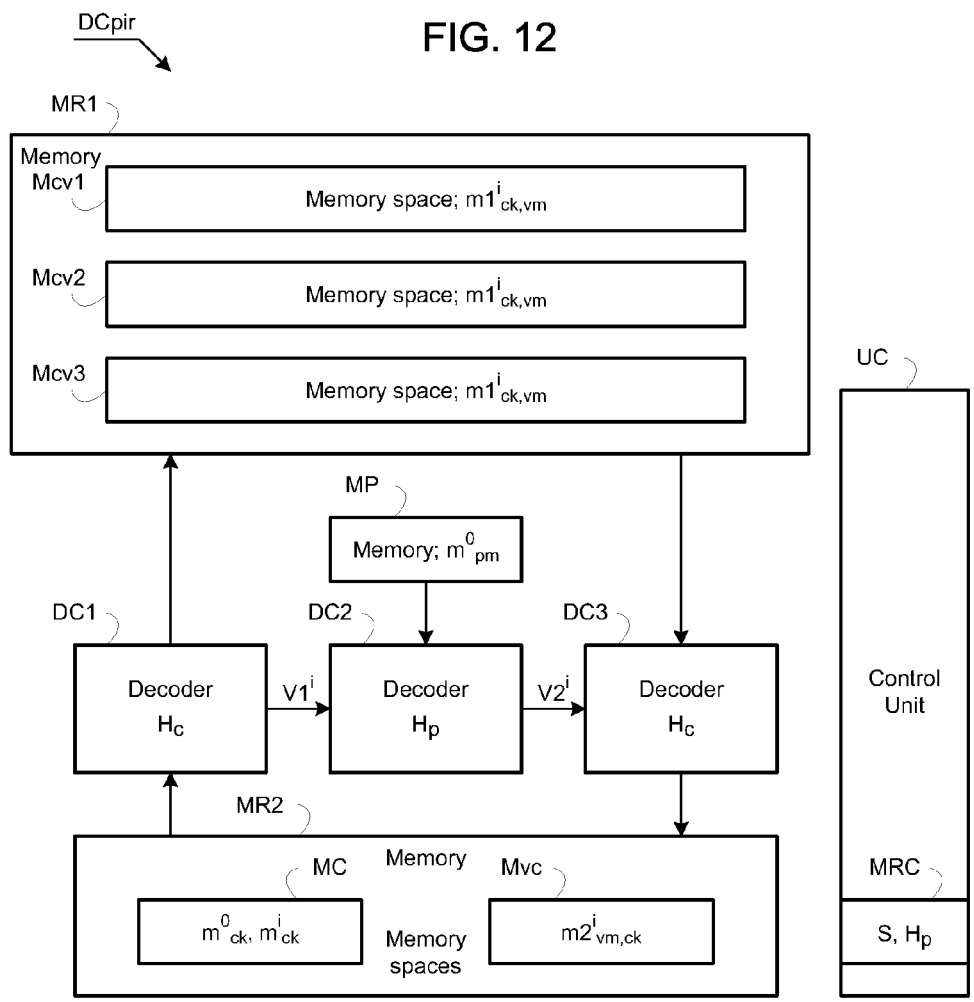
Figure 13:
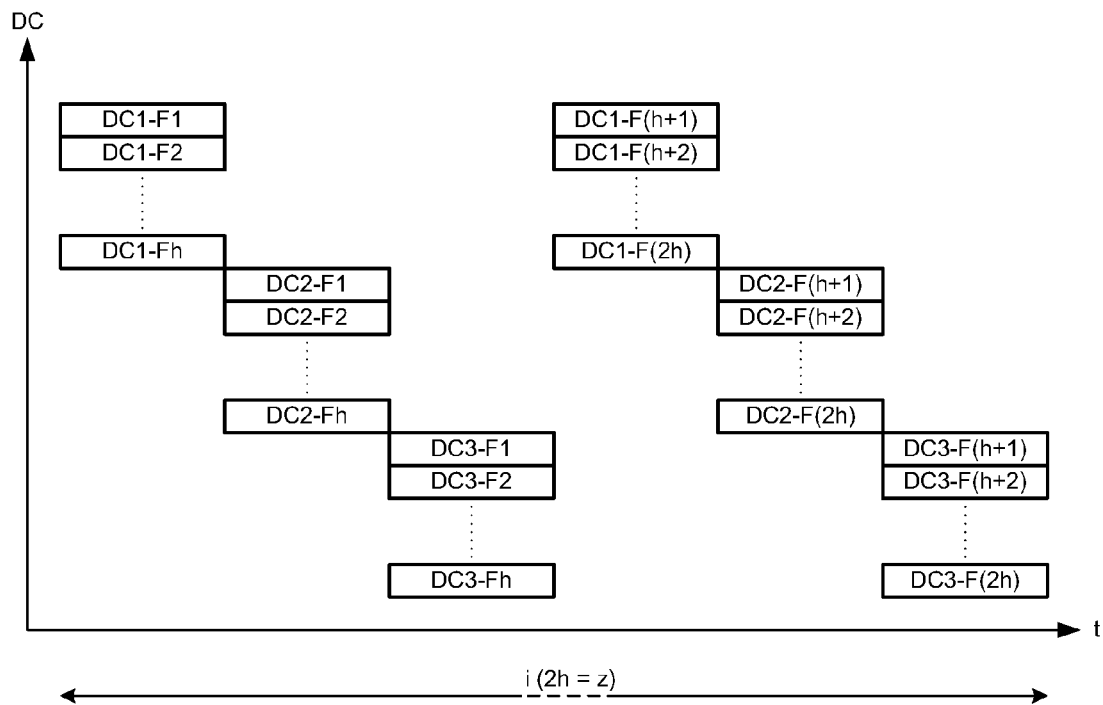
Figure 14:
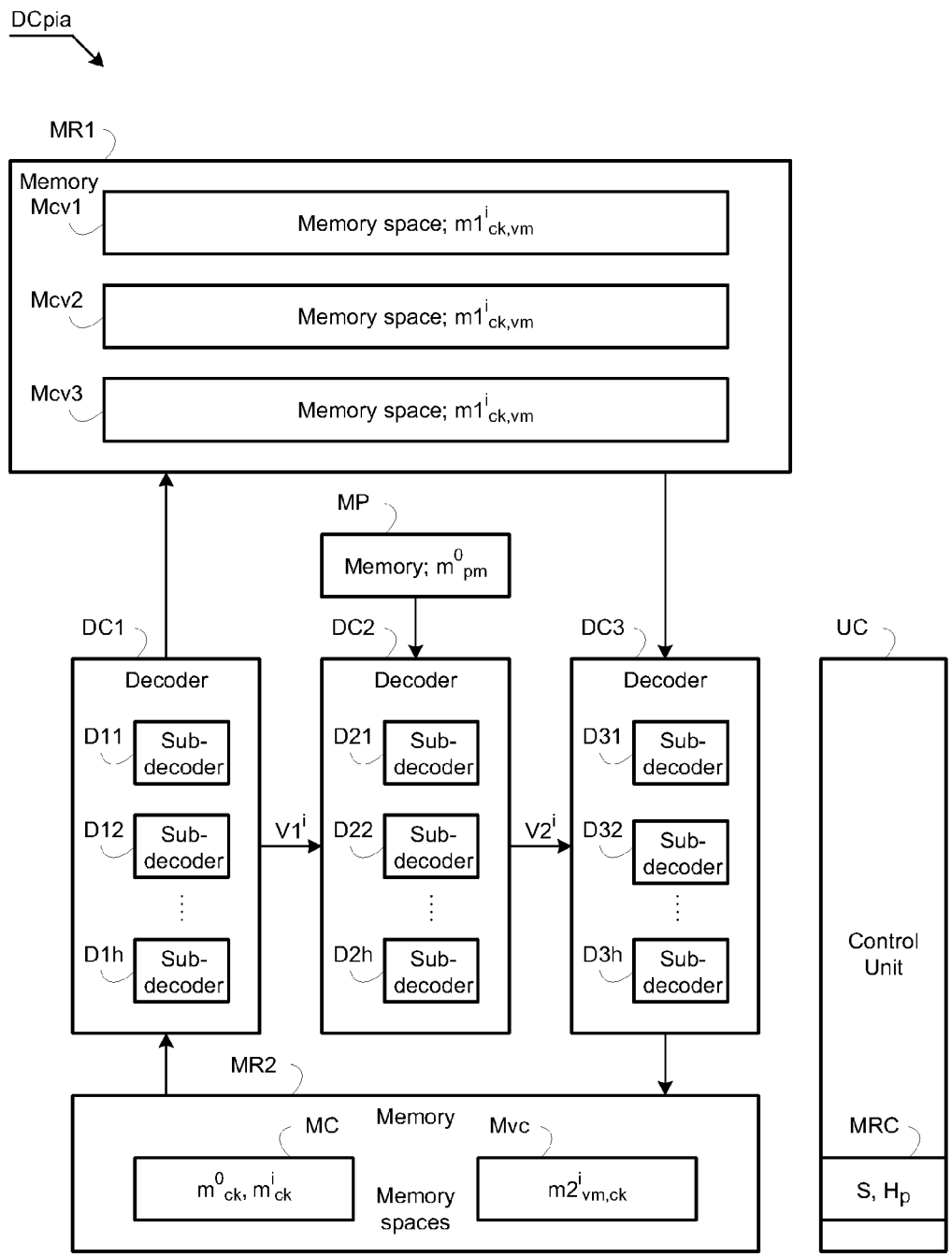

FIGS. 11 and 12 are respectively a timing diagram representing the operation of a decoding device and a block diagram representing the associated architecture of the decoding device, according to a third scheduling; and FIGS. 13 and 14 are respectively a timing diagram representing the operation of the decoding device and a block diagram representing the associated architecture of the decoding device, according to a fourth scheduling.

In reference to FIG. 1, a communication system according to the invention comprises a transmitter entity EM and a receiver entity ER. The transmitter entity transmits data via a transmission channel CT to the receiver entity ER.

The transmitter entity EM comprises a source unit SC that generates data sequences each represented by a data vector C provided to an encoding device CD. The encoding device determines a parity vector P encoded according to a LPDC code generated from a parity check matrix H described in relation with FIG. 2*a*. Both vectors C and P relative to a data sequence form a codeword X. Codewords from data sequences are successively produced by the encoding device to make up a encoded data signal.

The encoded data signal containing the codeword X is transmitted by the transmitter entity EM via the transmission channel CT to the receiver entity ER. The latter then receives a reception encoded signal that is distorted with respect to the transmission encoded signal. The transmission channel, also so-called propagation channel, can be an air channel or any other type of channel such as a cable. Because of disturbances in the transmission channel, each codeword X is distorted and becomes a distorted word Y included in the input data signal of the receiver entity ER. The transmission channel behaves as a non-deterministic distorting application between the input encoded data signal of the channel and the output encoded data signal of the channel.

In order to compensate for the effects due to transmission, the receiver entity ER has a decoding device DC which determines a better estimation of each data vector to form an estimated code signal comprising estimated data vectors.

The decoding device DC iteratively decodes each received word Y according to a decoding algorithm containing a LDPC code generated from the parity check matrix H. The decoding device estimates a vector substantially identical to the data vector C generated from the source SC of the transmitter entity EM. Each code signal containing the estimated vector is delivered to an information receiver RI, for example a sound reproducer provided with a loudspeaker.

A codeword X outputting from the transmitter entity EM includes N=K+M variables including K information or data variables c1 to cK forming a data vector C, and M parity variables p1 to pM forming a parity vector P. The variables are "0" or "1" bits. The yield R of the code is the ratio R=K/N.

In reference to FIG. 2*a*, the parity check matrix H has a size M×N, namely M rows and N columns, and maps the N variables of the codeword X to the M parity equations eq1 to eqM. Each parity equation the coefficients of which are the elements of a row of the matrix H thus comprises dc variables corresponding to dc "1" elements of said row, and each variable relative to a column of the matrix H is involved in dv parity equations corresponding to dv "1" elements of said column. According to one implementation of the invention, the parity check matrix H is semi-regular, that is each parity equation eq1 to eqM has the same number of variables, but each variable c1 to cK and p1 to pM is not connected to the same number of equations. This corresponds to a parity matrix comprising the same number of "1s" per row and a different number of "1s" per column.

The parity check matrix H is comprised of two matrices: a systematic matrix $H_c$ of a size M×K associated with the data variables c1 to cK of the data vector C, and a square parity matrix $H_p$ of a size M×M associated with the parity variables p1 to pM of the parity vector P.

The codeword X is decomposed as follows X=[C P] and satisfies the equation:

$$HX^T = [H_c \ H_p] \begin{bmatrix} C^T \\ P^T \end{bmatrix} = 0^T \quad (1)$$

where $X^T$, $C^T$ and $P^T$ are the transposes of vectors X, C and P, the equation (1) being decomposed into M parity equations eq1 to eqM.

A projection vector V comprising projection variables v1 to vM is defined by the following relationship:

$$V^T = H_c C^T \quad (2)$$

The parity variables p1 to pM of the parity vector P are deduced from the preceding relationships (1) and (2) in the encoding device CD:

$$P^T = H_p^{-1} V^T \quad (3)$$

In reference to FIG. 2*b* and the relationship (2), the quasi-cyclic form systematic matrix $H_c$ maps the data variables c1 to cK of the data vector C to the projection variables v1 to vM of the projection vector V. The systematic matrix $H_c$ consists of A×B square sub-matrices I(a,b) of the size z×z with $1 \leq a \leq A$ and $1 \leq b \leq B$. The square sub-matrices are null matrices and/or identity matrices permuted leftwards according to a permutation coefficient specific to each of these identity matrices.

With a view to minimize the memory space of the encoding device CD and the decoding device DC, the systematic matrix $H_c$ is defined by a simplified matrix S shown in FIG. 2*d*. The matrix S contains the respective permutation coefficients of the square sub-matrices, each coefficient defining the type of sub-matrix associated therewith. Thus, each square sub-matrix I(a,b) of the matrix $H_c$ is associated with a permutation coefficient $\delta(a,b)$ of the matrix S. If the coefficient $\delta(a,b)$ is negative, then the square sub-matrix I(a,b) is a null matrix. In the opposite case, the square sub-matrix I(a,b) is an identity matrix permuted by $\delta(a,b)$ positions leftwards.

According to the invention, selecting the values of permutation coefficients listed in the simplified matrix S satisfies one or more rules for constructing the parity check matrix H, in particular the systematic matrix $H_c$. These rules, being detailed in the following part of the description, optimize the decoding of the received word Y in terms of quickness of convergence of the decoding algorithm and are based on hardware constraints imposed on the decoding device.

In reference to FIG. 2*c* and the relationship (3), the parity matrix $H_p$, which is constant, maps the projection variables v1 to vM of the projection vector V to the parity variables p1 to pM of the parity vector P. The parity matrix $H_p$ is comprised of A×A square sub-matrices including the sub-matrices I and Ip (1, A) of the same size z×z. The square sub-matrices I are identity matrices bidiagonally disposed in the matrix $H_p$, i.e. in the centre diagonal and a sub-diagonal adjacent and parallel to the centre diagonal in the matrix $H_p$. The square sub-matrix Ip(1, A) is an identity matrix non-circularly permuted by one position, for example leftwards, that is having the right column made up of "0s". For example, the square sub-matrix Ip(1, A) of the size 4×4 is:

$$\begin{bmatrix} 0 & 0 & 0 & 0 \\ 1 & 0 & 0 & 0 \\ 0 & 1 & 0 & 0 \\ 0 & 0 & 1 & 0 \end{bmatrix}$$

The definition of such a matrix enables a simple encoding of the LDPC code.

The form of the parity check matrix $H_p$ defines a code of the IRA (Irregular Repeat-Accumulate) code family. This code is a serial accumulation of parity codes and of a flip-flop recursive convolutional code, shown in FIG. 7.

The parity check matrix H as shown in FIG. 2e relative to FIGS. 2b and 2c respectively representing the matrices $H_c$ and $H_p$, thus comprises A rows of square sub-matrices of the size z×z and A+B columns of square sub-matrices of the size z×z. Each row a of sub-matrices, with $1 \leq a \leq A$, comprises z parity equations, the parity check matrix then comprising a total of A z=M parity equations.

In order to optimize the decoding of a received encoded data signal inputting to the decoding device DC, the parity check matrix H is cut off into z decoding windows each comprising A parity equations. Each decoding window Ff with the index f, such as $1 \leq f \leq z$, comprises A following equations: eqf, eq(z+f), ..., eq((a−1)z+f), ..., eq((A−1)z+f). A decoding window Ff comprises one parity equation per row of square sub-matrices of the size z×z.

One advantage of decoding a encoded data signal divided into decoding windows Ff is to improve the convergence of the decoding algorithm. Variables determined during the decoding of a window Ff with A parity equations are used for decoding the A parity equations of the following decoding windows F(f+1).

The parity check matrix according to the invention is constructed, on the one hand, in order to optimize the convergence of the decoding algorithm, and the other hand, to consider the hardware cost requirements imposed. Both constraints are met through a diversified management of the execution scheduling of the decoding device, as shown in FIGS. 3, 8, 12 and 14, the contents of the parity check matrix H depending on the scheduling chosen and the architecture chosen for the decoding device.

The matrix H and more particularly the systematic matrix $H_c$ are constructed according to one or more construction rules based on the values of permutation coefficients δ(a,b) listed in the simplified matrix S. One or more construction rules of the systematic matrix $H_c$ correspond to bidiagonal form matrix. These construction rules avoid memory access conflicts in the decoding device in particular due to the implication of a same data variable in at least two parity equations simultaneously processed, which increases the quickness of convergence of the decoding algorithm and the bit rate of the decoding device. Accordingly, a first construction rule is that a data variable involved in the processing of a decoding window Ff containing A parity equations is only involved in one of the A parity equations of the window and is not involved in decoding steps of at least one other decoding window, for example when several decoding windows are simultaneously processed, as long as the processing of said window is not achieved. This is expressed at least by a "1" for only one of the A elements in at least one column of the systematic matrix $H_c$ associated with a decoding window Ff and by "0s" for the other A−1 elements of the column associated with the decoding window Ff.

Referring again to FIG. 1, the encoding device CD of the transmitter entity EM comprises two encoders CD1 and CD2 each corresponding to a processor which has generated a code for encoding from the parity check matrix H. The code of the encoder CD1 determines the variables v1 to vM of the projection vector V according to the relationship (2) as a function of the systematic matrix $H_c$ and the variables c1 to cK of the data vector C generated by the source SC. The code of the encoder CD2 determines the variables p1 to pM of the parity vector P according to the relationship (3) as a function of the matrix $H_p$ and the variables v1 to vM of the projection vector V previously determined by the encoder CD1. The codeword X outputting from the encoding device CD is formed from the variables c1 to cK of the data vector C and the variables p1 to pM of the parity vector P. The variables involved in encoding the data sequence are binary values "0" or "1".

Upon receiving the distorted encoded data signal, the binary variables of the vector C and P are for some of them also distorted and erroneous. To obtain data variables similar to those generated by the source unit SC of the encoding device CD, at the output of the decoding device DC, the latter estimates at each iteration i data variables, called in the following part of the description "likelihood variables", which will form the code signal estimated. After a predefined number I of iterations, the likelihood variables are used to determine the estimated vector $C^I$ closest to the vector C generated. The decoding algorithm implemented in the decoding device DC is based on a belief propagation (BP) algorithm which is an iterative algorithm with soft inputs.

All the variables involved in the decoding algorithm are weighted variables, for example of the LLR ("Log Likelihood Ratio") type, each comprising a sign defining the hard binary value "0" or "1" of the variable and a soft value specifying the reliability of this hard binary value.

Figure 3:
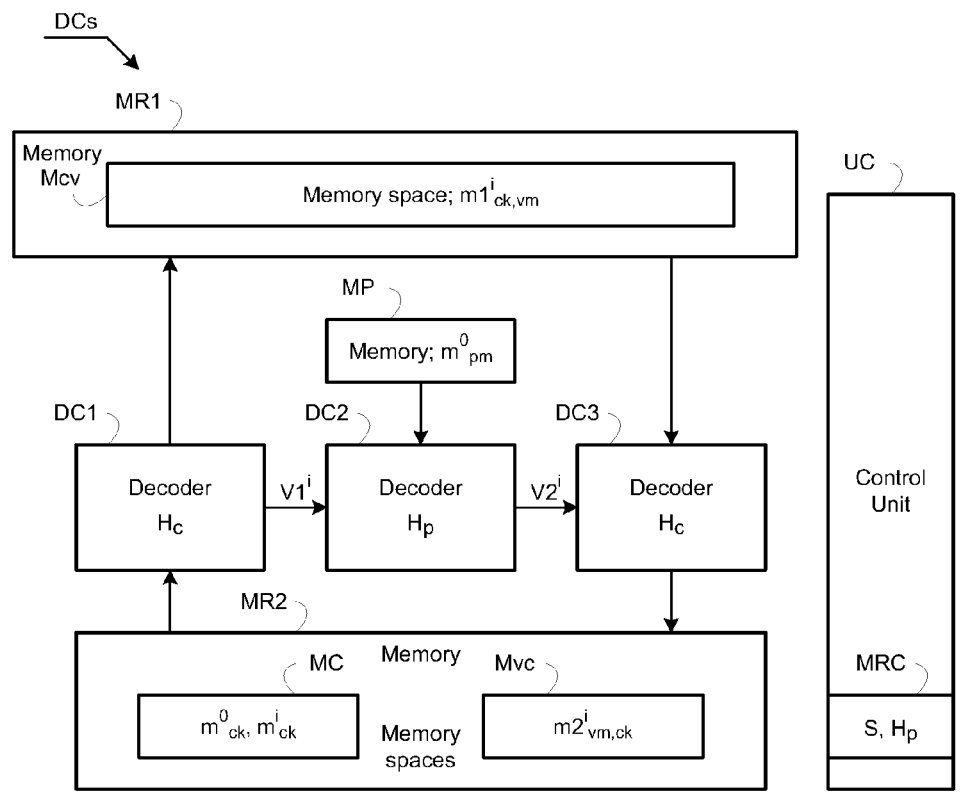
FIGS. 3 and 4 are respectively a block diagram representing the architecture of the decoding device according to the invention and a timing diagram representing the operation of the decoding device, according to a first scheduling.

In reference to FIG. 3, the decoding device DCs implementing the decoding algorithm according to the first scheduling comprises three decoders DC1, DC2 and DC3, memories MR1, MR2 and MP and a control unit UC which controls all the elements of the decoding device DC. All these elements are shown as functional blocks, the most of which provide functions related to the invention and can correspond to software and/or hardware modules.

The three decoders DC1, DC2 and DC3 are processors each comprising part of the decoding instructions according to the LDPC decoding algorithm, set out depending upon the parity check matrix H. The operation of the three decoders will be described more in detail in reference to FIGS. 5, 6, 7 and 8.

The memory MR1 comprises at least one memory space Mcv containing for each processing of the decoding window Ff first extrinsic variables $m1^i_{ck,vm}$ determined by the decoder DC1 and exchanged between the decoder DC1 and the decoder DC3, with the index ck such that $c1 \leq ck \leq cK$ and the index vm such that $v1 \leq vm \leq vM$.

The memory MR2 comprises a memory space Mcv containing for each iteration i second extrinsic variables $m2^i_{vm,ck}$ determined by the decoder DC3 and exchanged between the decoder DC3 and the decoder DC1, with the indices vm and ck such that $v1 \leq vm \leq vM$ and $c1 \leq ck \leq cK$. The memory MR2 also comprises a data memory space MC containing intrinsic data variables $m^o_{c1}$ to $m^o_{cK}$ obtained from observing the transmission channel CT and the likelihood variables $m^i_{c1}$ to $m^i_{cK}$ estimated by the decoder DC3 at each iteration I and which should correspond to the data variables c1 to cK transmitted.

The parity memory MP, accessible through the decoder DC2, comprises intrinsic parity variables $m^o_{p1}$ and $m^o_{pM}$ obtained from observing the parity vector P coming from the channel CT.

To reduce the hardware costs relating to the decoding device architecture, the memory spaces MC, Mvc and Mcv and the memory MP are regarded as memories having a single port whose reading and writing accesses are not simultaneous.

The variables $m1^i_{ck,vm}$, $m^o_{c1}$ to $m^o_{cK}$, $m2^i_{vm,ck}$, $m^i_{c1}$ to $m^i_{cK}$ and $m^o_{p1}$ and $m^o_{pM}$ are LLR ("Log Likelihood Ratio") type weighted variables.

The decoders DC1, DC2, DC3 and the memories of the decoding device DCs are controlled by the control unit UC which manages access to memories and the scheduling of operation of the decoders depending on the contents of the parity check matrix H and more particularly of the simplified matrix S, and the decoding windows F1 to Fz. The unit UC comprises or is connected to a control memory MRC containing in particular the simplified matrix S and the parity matrix $H_p$.

Figure 4:
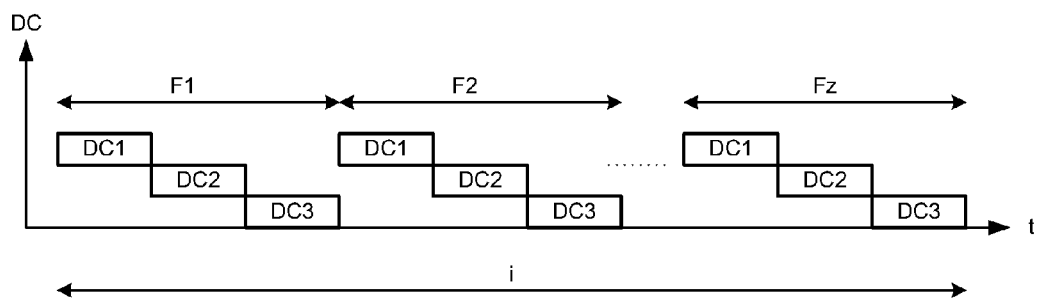

According to a first scheduling of serial type operation, shown in FIG. 4, the three decoders DC1, DC2 and DC3 each operate in turn to process one decoding window at a time.

To optimize the convergence of decoding, the construction rule of the parity check matrix H relative to the serial scheduling is as follows. All the data variables involved in the parity equations of a the decoding window should be different, which results in the positive permutation coefficients associated with the identity matrices in a same column of the systematic matrix S being different.

This construction rule is expressed by the following relationship for the column of index b:

$$\delta(a,b) \neq \delta(j,b),$$

$\forall a \neq j$ such that $1 \leq a \leq A$ and $1 \leq j \leq A$, and $\forall$ b such that $1 \leq b \leq B$, in reference to FIG. 2c.

Figure 5:
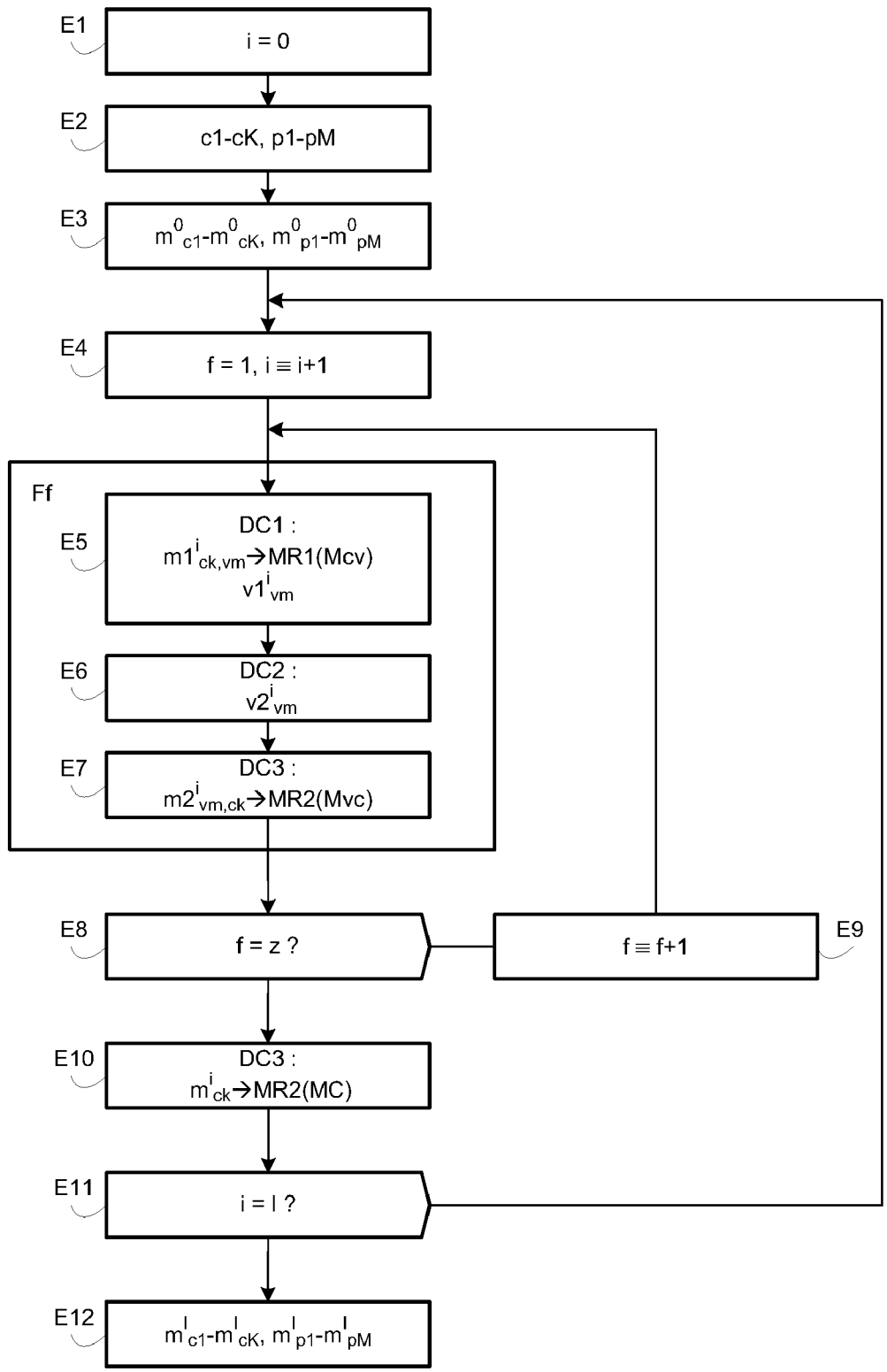
FIG. 5 is a decoding algorithm relating to the first scheduling of operation of the decoding device according to the invention.

The decoding algorithm relative to the serial scheduling shown in FIG. 5 comprises steps E1 to E12.

Upon receiving the transmission signal containing the distorted codeword Y, in steps E1 and E2, the control unit UC of the decoding device DCs determines a LLR type intrinsic variable as a function of each transmitted binary variable c1 to cK and p1 to pM of the respective distorted vectors C and P, in step E3. The control unit UC determines the intrinsic data variables $m^o_{c1}$ to $m^o_{cK}$ from the variables transmitted from the distorted data vector C, and the intrinsic data variables $m^o_{p1}$ to $m^o_{pM}$ from the variables transmitted from the distorted parity vector P. All the intrinsic variables determined are stored in the memory space MC of the memory MR2.

At each iteration i in steps E4 to E11, the decoding device DCs processes the z decoding windows. Upon processing a decoding window Ff comprising A parity equations, with $1 \leq f \leq z$ and for any scheduling type, the decoding algorithm comprises three separate decoding steps E5, E6 and E7 respectively processed in the decoders DC1, DC2 and DC3 of the decoding device DC.

For each processing of a decoding window Ff, the unit UC grants the decoders a writing and reading access to the memories MR1, MR2 and MP for reading and writing therein variables respectively involved in the A equations of the window Ff depending on the elements of the simplified matrix S and the matrix $H_p$ read in the memory MRC, during the decoding.

The first decoding step E5 implemented in the decoder DC1, enabled by the control unit UC, consists in solving the A parity equations of the window Ff defined by the systematic matrix $H_c$ in particular from the intrinsic data variables $m^o_{c1}$ to $m^o_{cK}$ to obtain A first intermediate variables, called first weighted projection variables $V1^i_{vf}$, $V1^i_{v(z+f)}$, . . . , $V1^i_{v((a-1)z+f)}$, . . . , $V1^i_{v((A-1)z+f)}$ to be provided to the decoder DC2.

Figure 6:
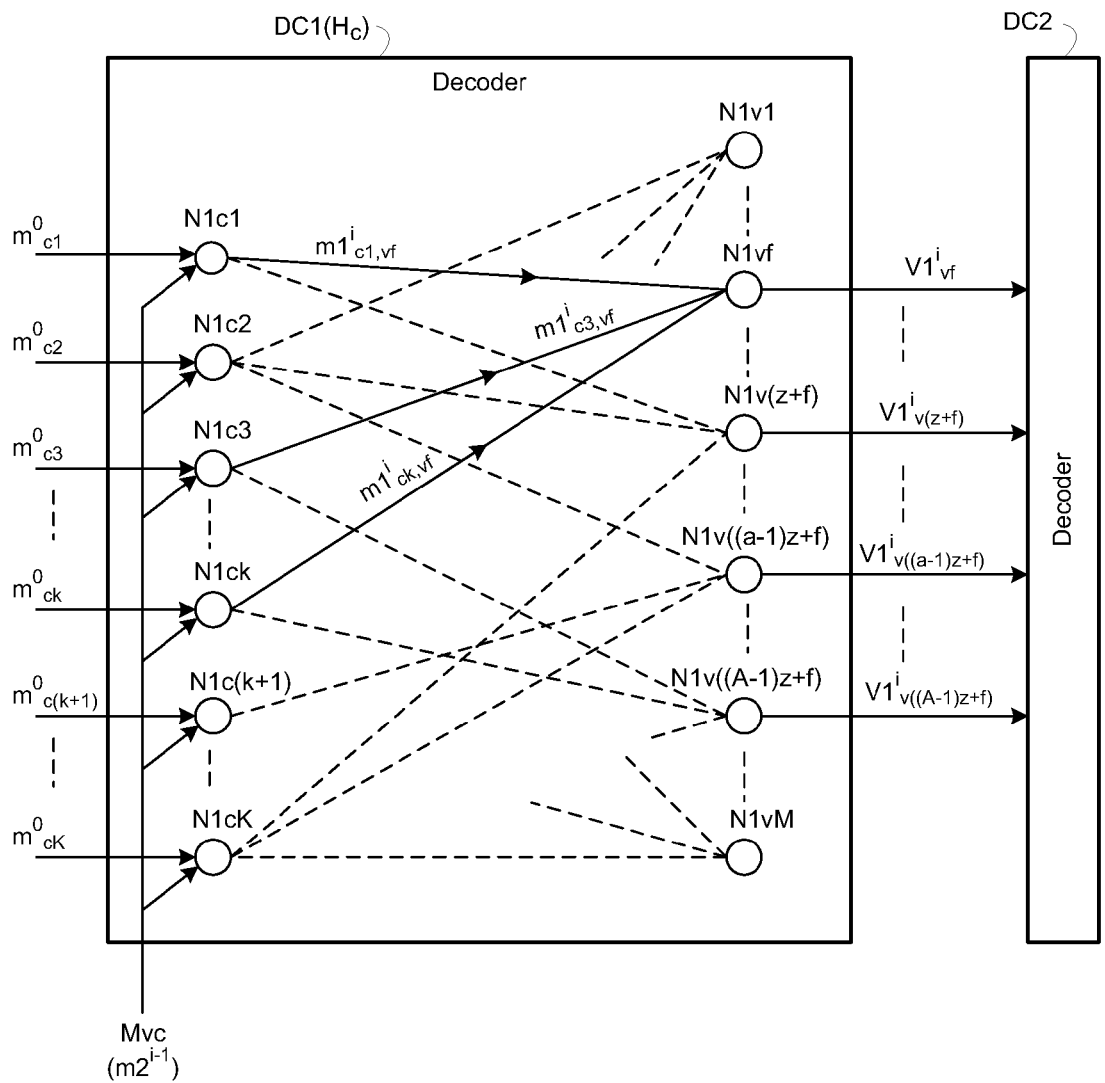
FIGS. 6, 7 and 8 are schematic block diagrams representing three decoders in the decoding device according to the invention.

The part of the LDPC decoding instructions in the decoder DC1 is shown schematically in FIG. 6 with data nodes N1c1 to N1cK managing the data variables c1 to cK and connected in accordance with the systematic matrix $H_c$ to projection nodes N1v1 to N1vM managing projection variables v1 to vM. Only the projection nodes N1vf, N1v(z+f), . . . , N1v((a−1)z+f), . . . and N1v((A−1)z+f) intervene in processing the A parity equations of the window Ff, in accordance with FIG. 2e.

Upon processing one of the A equations of the window Ff, relating dc data nodes to a projection node, for example the projection node N1vf, each data node N1ck associated with data variables ck intervening in the equation determines a first extrinsic variable $m1^i_{ck,vf}$ to be provided to the projection node N1vf. The first extrinsic variable $m1^i_{ck,vf}$ associated with the data variable ck is determined by applying a function g to the intrinsic data variable $m^o_{ck}$ stored in the memory space MC and to second extrinsic variables $m2^{i-1}_{vj,ck}$ associated with the other projection variables vj, with the index j different from the index f, relating to the other parity equations eqj which contain the data variable ck. These second extrinsic variables $m2^{i-1}_{vj,ck}$ are determined by the decoder DC3 upon the previous iteration i−1 and are stored in the memory space Mvc of the memory MR2. The determination of such extrinsic variables is detailed in reference to FIG. 8.

Figure 8:
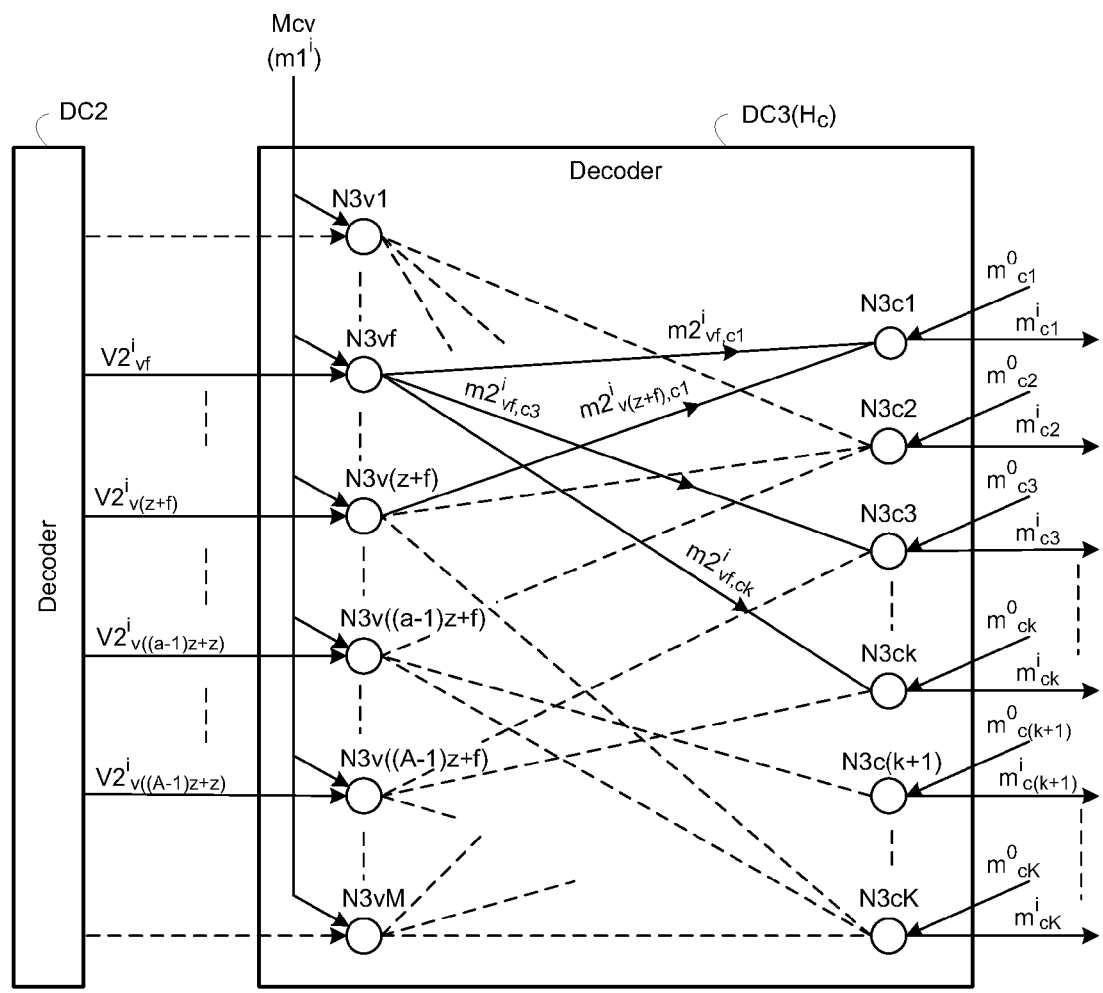

According to an example illustrated in FIG. 6 and in part in FIG. 8, upon solving one of the A equations of the window Ff mapping the data nodes N1c1, N1c3 and N1ck to the projection node N1vf, the data node N1c1 determines and transmits to the projection node N1vf the first extrinsic variable $m1^i_{c1,vf}$ determined according to the following relationship:

$$m1^i_{c1,vf} = g(m^o_{c1}, m2^{i-1}_{v(z+f),c1}).$$

In this relationship, the second extrinsic variable $m2^{i-1}_{vf,c1}$ relating to the projection variable of and determined by the decoder DC3 upon the previous iteration i−1 is not involved in determining the first extrinsic variable $m1^i_{c1,vf}$ and the function g is the function for solving a parity equation. For LLR type variables and in the case of a simplified algorithm, the function g may be such that:

$$g(x_1, \ldots x_q, \ldots x_Q) = \text{sign}(x_1) \ldots \text{sign}(x_q) \ldots \text{sign}(x_Q)$$
$$\min(|x_1|, \ldots |x_q|, \ldots |x_Q|),$$

where "sign" is the sign function defining the hard binary value "0" or "1" of a variable $x_q$ and $|x_q|$ is a positive soft value specifying the reliability of this hard binary value.

The first extrinsic variables resulting from solving the A equations of the window Ff for the iteration i from the systematic matrix $H_c$ are simultaneously determined and provided to the A associated projection nodes N1vf, N1v(z+f), . . . , N1v((a−1)z+f), . . . and N1v((A−1)z+f).

Upon reception of the first extrinsic variables, each projection node, for example the node N1vf, intervening in solving the A equations of the decoding window Ff determines a first weighted projection variable $V1^i_{vf}$ to be transmitted to the decoder DC2.

The first weighted projection variable $V1^i_{vf}$ is determined in the projection node N1vf by applying the function g to all the first extrinsic variables transmitted by the dc data nodes to which the node N1$vf$ is connected.

According to one example in reference to FIG. 6, the projection node N1$vf$ connected to the data nodes N1$c$1, N1$c$3 and N1$ck$ receives the first extrinsic variables m1$^i_{c1,vf}$, m1$^i_{c3,vf}$ and m1$^i_{ck,vf}$ respectively from the three above-mentioned data nodes and determines the first projection variable V1$^i_{vf}$ according to the following relationship:

$$V1^i_{vf} = g(m1^i_{c1,vf}, m1^i_{c3,vf}, m1^i_{ck,vf}).$$

The decoder DC1 provides to the decoder DC2 the first weighted projection variables V1$^i_{vf}$, V1$^i_{v(z+f)}$, ..., V1$^i_{v((a-1)z+f)}$, ..., V1$^i_{v((A-1)z+f)}$ determined upon solving the A equations of the window Ff. Then, the control unit UC disables the decoder DC1.

The second decoding step E6 implemented in the decoder DC2 enabled by the control unit UC consists in determining the internal code, that is solving A parity equations of the window Ff defined by the parity matrix H$_p$ from the A first weighted projection variables V1$^i_{vf}$, V1$^i_{v(z+f)}$, ..., V1$^i_{v((a-1)z+f)}$, ..., V1$^i_{v((A-1)z+f)}$ produced by the decoder DC1 and A intrinsic parity variables m$^o_{pf}$, m$^o_{p(z+f)}$, ..., m$^o_{p((a-1)z+f)}$, ..., m$^o_{p((A-1)z+f)}$ stored in the memory MP to obtain A second intermediate variables, so-called second weighted projection variables V2$^i_{vf}$, V2$^i_{v(z+f)}$, ..., V2$^i_{v((a-1)z+f)}$, ..., V2$^i_{v((A-1)z+f)}$ to be provided to the third decoder DC3.

The decoder DC2 is a differential decoder and uses a weighted output convolutional code decoding technique according to the contents of the parity matrix H$_p$, such as the forward backward algorithms (FBA) like the BCJR (Bahl-Cocke-Jelinek-Raviv) algorithm.

Figure 7:
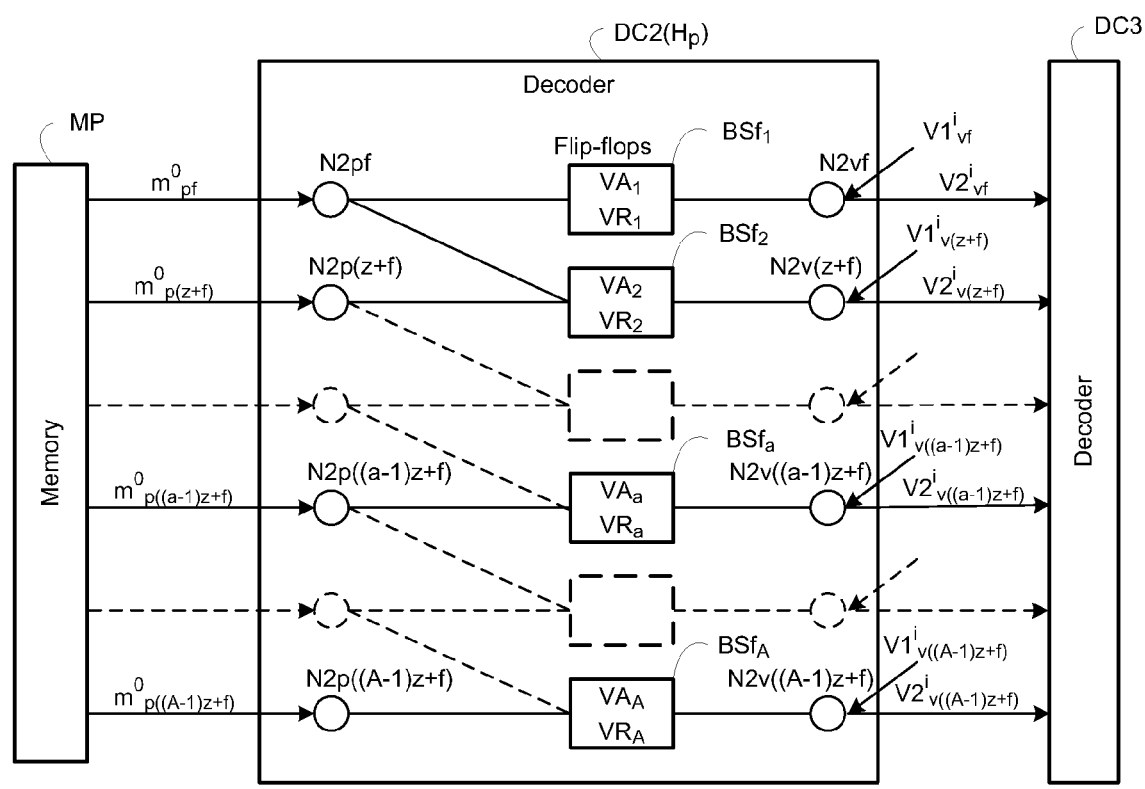

The part of LDPC decoding instructions of the FBA type decoder DC2 is shown schematically in FIG. 7 with A projection nodes N2$vf$ to N2$v((A-1)z+f)$ managing projection variables and respectively connected to A parity nodes N2$pf$ to N2$p((A-1)z+f)$ managing parity variables according to the A parity equations of the window Ff defined by the matrix H$_p$.

Each parity equation defined by the matrix H$_p$, for example the equation eq($z+f$), relates the projection node N2$v(z+f)$ to the parity node N2$p(z+f)$ associated by a flip-flop BSf$_2$ in turn related to the parity node N2$pf$ related to the previous equation eqf. The first flip-flop BSf$_1$ is only related to the associated parity node N2$pf$, and the last parity node N2$p((A-1)z+f)$ is only related to the associated flip-flop BSf$_A$.

The decoding algorithm in the FBA type decoder DC2 comprises three known sub-steps.

In the first sub-step, each flip-flop BSf$_a$ relating to solving the respective parity equation eq($(a-1)z+f$), with a ranging from 1 to A, determines and successively stores a forward value VA$_a$ according to the following relationship:

$$VA_a = g((m^o_{p((a-2)z+f)} + VA_{a-1}), V1^i_{v(a-1)z+f)})$$

in which the intrinsic parity variable m$^o_{p((a-2)z+f)}$ relates to the parity equation eq($(a-2)z+f$), the forward value VA$_{a-1}$ is previously determined in the flip-flop BSf$_{a-1}$ also relating to the equation eq($(a-2)z+f$), and the first weighted projection variable V1$^i_{v((a-1)z+f)}$ relates to the equation eq($(a-1)z+f$).

In the second sub-step, each successive flip-flop BSf$_a$, with a ranging from A to 1, determines and stores a backward value according to the following relationship:

$$VR_a = g((m^o_{p(az+f)} + VR_{a+1}), V1^i_{v(az+f)})$$

in which the intrinsic parity variable m$^o_{p(az+f)}$ and the first projection variable V1$^i_{v(az+f)}$ relate to the parity equation eq($az+f$) and the backward variable VR$_{a+1}$ is previously determined in the flip-flop BSf$_{a-1}$ relating to the equation eq($az+f$).

Finally, in the third sub-step, each flip-flop BSf$_a$, with a ranging from 1 to A, determines a second weighted projection variable V2$^i_{v((a-1)z+f)}$ according to the following relationship:

$$V2^i_{v((a-1)z+f)} = g(m^o_{p(az+f)} + VA_{a-1}, m^o_{p((a-1)z+f)} + VR_a).$$

All the second weighted projection variables V2$^i_{vf}$, V2$_{v(z+f)}$, ..., V2$^i_{v((a-1)z+f)}$, ..., V2$^i_{v((A-1)z+f)}$ relating to the decoding window Ff and determined by the decoder DC2 are provided to the decoder DC3. Then, the control unit UC disables the decoder DC2.

One advantage of decoding through decoding window is to reduce the memory space useful in the decoder DC2 by only storing the A forward variables VA$_1$ to VA$_A$ and the A backward variables VR$_1$ to VR$_A$ during each processing of a decoding window Ff. However, decoding through a window causes the variables at the edge of each window Ff to be discontinued upon determining the first forward variables VA$_1$ which does not depend on the last variable VA$_A$ of the previous window F(f−1). To minimize the edge effects and correctly initialize the parity decoding in the following window Ff, after providing the second weighted projection variables to the decoder DC3, the decoder DC2 stores in the flip-flop BSf$_1$ the value VA$_A$ which then becomes the value VA$_1$ upon processing the following window Ff.

The third decoding step E7 implemented in the decoder DC3 enabled by the control unit UC consists in checking the A parity equations of the window Ff defined by the systematic matrix H$_c$ by determining the second intrinsic variables from the second weighted projection variables V2$^i_{vf}$, V2$^i_{v(z+f)}$, ..., V2$^i_{v((a-1)z+f)}$, ..., V2$^i_{v((A-1))z+f)}$ provided by the decoder DC2.

The part of the LDPC decoding instructions in the decoder DC3 is shown schematically in FIG. 8 with the projection nodes N3$v$1 to N3$v$M managing projection variables v1 to vM, connected according to the systematic matrix H$_c$ to data nodes N3$c$1 to N3$c$K managing data variables c1 to cK. Only the projection nodes N1$vf$, N1$v(z+f)$, ..., N1$v((a-1)z+f)$, ... and N1$v((A-1)z+f)$ intervene for processing the A parity equations of the window Ff.

Upon checking one of the A parity equations of the decoding window Ff, for example the equation eqf, the projection node N3$vf$ associated to the projection variable V2$^i_{vf}$ determines dc second extrinsic variables to be provided to the dc data nodes, the associated data variables of which are involved in the parity equation eqf. The second extrinsic variable m2$^i_{vf,ck}$ to be provided to the data node N3$ck$, the associated data variable of which ck is involved in the parity equation eqf, is determined by applying the function g to the second weighted projection variable V2$^i_{vf}$ associated with the projection variable of and provided by the decoder DC2, and to the first extrinsic variables m1$^i_{cj,vf}$ associated with the other data variables cj, with j different from k, involved in the parity equation eqf and determined by the decoder DC1 during the first decoding step.

According to one example in reference to FIG. 8, the projection node N3$vf$ determines and respectively transmits to data nodes N3$c$1, N3$c$3 and N3$ck$ the second extrinsic variables m2$^i_{vf,c1}$, m2$^i_{vf,c3}$ et m2$^i_{vf,ck}$.

The projection node N3$vf$ determines the second extrinsic variable m2$^i_{vf,c1}$ to be provided to the data node N3$c$1 according to the following relationship:

$$m2^i_{vf,c1} = g(V2^i_{vf}, m1^i_{c3,vf}, m1^i_{ck,vf}),$$

where the first extrinsic variable m1$^i_{c1,vf}$ relative to the data variable c1 and previously determined by the decoder DC1 is not involved in determining the extrinsic variable m2$^i_{vf,c1}$.

Each data node Nick controls storing the second extrinsic variables provided in the memory space Mvc of the memory MR2. Then, the control unit UC disables the decoder DC3.

The second extrinsic variables provided will be involved in determining the first extrinsic variables in the decoder DC1 upon the following iteration i+1.

In step E8, the control unit UC checks if all z decoding windows are processed. In the opposite case, another decoding window is implemented in step E9 and is processed in steps E5 to E7.

If the z decoding windows are processed, the control unit UC enables the decoder DC3 in step E10 to estimate the likelihood variables $m^i_{ck}$ to $m^i_{cK}$. Each likelihood variable $m^i_{ck}$ is estimated by applying the function g to the associated intrinsic variable $m^0_{ck}$ and stored in the memory space MC and to the second extrinsic variables $m2^i_{vf,ck}$ associated with the data variable ck and stored in the memory space Mcv of the memory MR2.

According to one example in reference to FIG. 8, the data node N3c1 estimates the likelihood variable $m^i_{c1}$ according to the relationship, assuming that only the second extrinsic variables $m2^i_{vf,c1}$ and $m2^i_{v(z+f),c1}$ are associated with the data variable c1:

$$m^i_{c1} = g(m^0_{c1}, m2^i_{vf,c1}, m2^i_{v(z+f),c1}).$$

In step E11, the control unit UC checks if all I iterations are executed. In the opposite case, another iteration i is implemented in step E4 and the z decoding windows are processed again in steps E5 to E8.

If the I iterations are processed, the control unit UC sets an estimated data signal containing the likelihood variables $m^I_{c1}$ to $m^I_{cK}$ substantially corresponding to the data variables generated by the source entity SC of the transmitter entity EM, and provides the estimated data signal to the information receiver RI of the receiver entity ER, in the step E12.

Ideally, solving a parity equation should be made in one clock cycle requiring all the variables involved in solving the parity equation to be loaded in parallel.

A first embodiment consists in reading the memories MR1, MR2 and MP at a higher rate than the operating rate of the decoders.

A second embodiment consists in dividing the memory spaces MC, Mcv and Mvc and the memory MP into memory sub-banks, the memory spaces and the memory MP being single port memories requiring one writing and one reading at a time. Dividing the single port memories is carried out taking into account the construction properties of the parity check matrix H. The dc variables involved in a parity equation are defined by dc "1s" in the row of the parity check matrix H defining the equation. By construction, each "1" belongs to dc different blocks of the size z×z. A judicious cutting off for the memory spaces MC, Mcv and Mvc and the memory MP, defined in A memory banks of the size z avoids any access conflict to a single port memory.

The decoding rate D of the serial scheduling is expressed by the following relationship:

$$D = K/(3FTI),$$

with K being the total number of data variables, z the size of a square matrix, I the number of iterations and the time T such that: $T = \alpha A\, T_{clk}$, where $\alpha$ is a coefficient equal to or greater than 1 and close to 1, A is the number of parity equations in a decoding window and $T_{clk}$ is the clock time of the decoding device.

The serial scheduling implemented in the decoding device DCs shown in FIG. 3 imposes a serial processing of the z decoding windows upon an iteration i, thus having a great idle time of the different decoders DC1, DC2, DC3, two out of the three decoders being idle while the third is enabled, as shown in FIG. 4.

Figure 9:
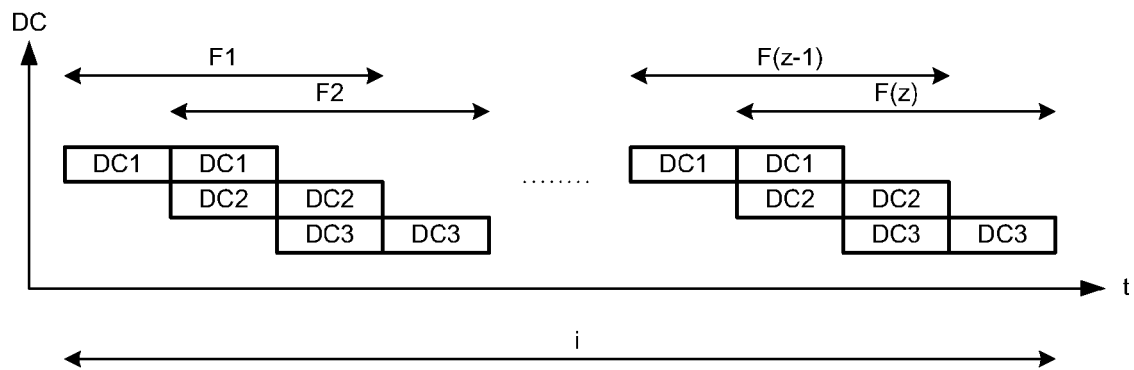
FIGS. 9 and 10 are respectively a timing diagram representing the operation of the decoding device and a block diagram representing the associated architecture of the decoding device, according to a second scheduling.

In order to overcome the idle time of the decoders in the decoding device DCs, a so-called semi-parallel second scheduling, shown in FIG. 9, implements a simultaneous operation of two decoders out of the three, without simultaneously enabling the decoders DC1 and DC3 of de decoding device DCsp, which would generate a problem of reading and writing access to the memory space Mcv in the single port memory MR1. The two simultaneously operating decoders DC1 and DC2, or DC2 and DC3 process different parts from two successive decoding windows.

In the second scheduling, only two successive windows Ff and F(f+1) are semi-parallelly processed at a time, their processings overlapping each other over two decoding steps. The decoding window F(f+1) does not benefit from the decoding of the previous window Ff. The parity check matrix H is constructed such that data variables involved in solving the A equations of the window Ff and those involved in solving the A equations of the window F(f+1) are different.

Thus, for the decoding algorithm to converge more quickly while reducing the decoding latency as compared to the first scheduling, the construction rules of the parity check matrix H relating to the semi-parallel scheduling are as follows. According to a first rule, the positive permutation coefficients associated with the identity matrices in a same column of the simplified matrix S should be different from one another. According to a second rule, in a column of the matrix $H_c$ corresponding to a data variable, this data variable can only be processed during one of two successive windows, which is illustrated in the matrix $H_c$ by a single element "1" in the rows of said column relating to two successive windows, or by any two permutation coefficients in said column of the matrix S, having their difference different from 1 modulo z, where z is the size of the identity matrix.

These construction rules are expressed by the following relationships for a column of index b of the matrix S:

$$\delta(a,b) \neq \delta(j,b), \qquad 1)$$

$$\delta(a,b) \neq (1 + \delta(j,b)) \bmod z, \qquad 2)$$

$\forall a \neq j$ such that $1 \leq a \leq A$ and $1 \leq j \leq A$, and $\forall$ b such that $1 \leq b \leq B$, in reference to FIG. 2c.

One advantage of these construction rules is that of optimizing the convergence of the decoding algorithm identically to the serial scheduling while parallelizing the operation of two decoders at the same time.

Figure 10:
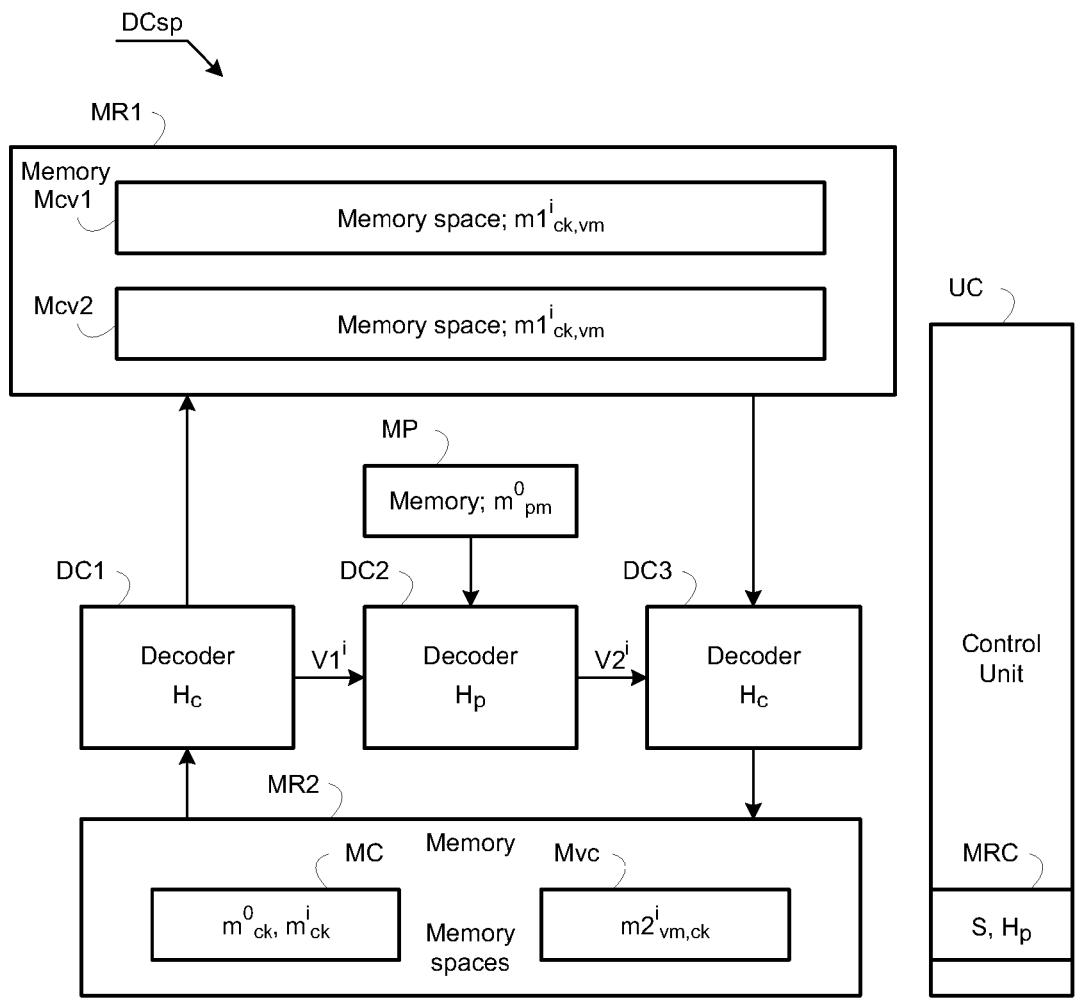

The architecture of the decoding device DCsp implementing the semi-parallel scheduling as shown in FIG. 10 only differs from the one implementing the serial scheduling by the space organization in the memory MR1 allowing exchanging the first extrinsic variables between the decoder DC1 and the decoder DC3. The memory MR1 comprises two memory spaces Mcv1 and Mcv2. The memory space Mcv1 is dedicated to storing the first extrinsic variables determined by the decoder DC1 upon processing a first decoding window Ff. The memory space Mcv2 is dedicated to storing the first extrinsic variables determined by the decoder DC1 upon processing the next decoding window F(f+1), following the first window Ff.

According to the so-called parallel inter-decoder third scheduling, shown in FIG. 11, the three decoders DC1, DC2 and DC3 simultaneously operate in the decoding device DCpir and each process one part of three successive decoding windows Ff, F(f+1) and F(f+2). Thus, in parallel, the decoder DC1 solves the parity equations of the decoding window F(f+2) defined by the systematic matrix $H_c$, the decoder DC2 processes the parity equations of the decoding window F(f+1) defined par the parity matrix $H_p$, and the decoder DC3 checks the parity equations of the window Ff defined by the systematic matrix $H_c$.

During the inter-decoder parallel decoding of the parity equations of the window F(f+2) by the decoder DC1 and of the parity equations of the window Ff by the decoder DC3, a common first extrinsic variable could be involved in both windows, then causing an access conflict to the memory MR1. To overcome this problem, the parity check matrix H is constructed such that the data variables involved in solving the A equations of the window Ff, those involved in solving the A equations of the window F(f+1) and those involved in solving the A equations of the window F(f+2) are different.

Thus, for the decoding algorithm to converge more quickly while reducing the decoding latency and avoiding the simultaneous access problems to the memory MR1, the construction rules of the parity check matrix H relating to the inter-decoder parallel scheduling comprise the first and second rules defined for the so-called semi-parallel second scheduling and a third rule similar to the second one.

In a column of index b of the matrix $H_c$ corresponding to a data variable, 1) the positive permutation coefficients associated with the identity matrices in a same column of the simplified matrix S are different from one another, that is:

$$\delta(a,b) \neq \delta(j,b);$$

2) the data variable can only be processed during one of two successive windows which is illustrated in matrix $H_c$ by a single element "1" in the rows of said column relating to two successive windows, or by any two permutation coefficients in said column of the matrix S having their difference different from 1 modulo z, where z is the size of the identity matrix, that is:

$$\delta(a,b) \neq (1+\delta(j,b)) \bmod z; \text{ and}$$

3) the data variable can only be processed during one of three successive windows which is illustrated in the matrix $H_c$ by a single element "1" in the rows of said column relating to three successive windows, or by any two permutation coefficients in said column of the matrix S having their difference different from 2 modulo z, where z is the size of the identity matrix, that is:

$$\delta(a,b) \neq (2+\delta(j,b)) \bmod z;$$

$\forall$ a$\neq$j such that $1 \leq a \leq A$ and $1 \leq j \leq A$, and $\forall$ b such that $1 \leq b \leq B$, in reference to FIG. 2c.

The third scheduling maximizes the activity of each decoder and increases the decoding rate of a data sequence by the following factor Fa:

$$Fa = 3K/(K+2A)$$

with K the total number of data variables and A the number of parity equations in a decoding window.

The architecture of the decoding device DCpir implementing the inter-decoder parallel scheduling and represented in FIG. 2 only differs from those implementing the serial and semi-parallel schedulings by the space organization in the memory MR1 enabling the exchange of the first extrinsic variables relating to the decoding of a decoding window between the decoder DC1 and the decoder DC3. The memory MR1 comprises three memory spaces Mcv1, Mcv2 and Mcv3. The memory space Mcv1 is dedicated to storing the first extrinsic variables determined by the decoder DC1 upon processing a first decoding window Ff. The memory space Mcv2 is dedicated to storing the first extrinsic variables determined by the decoder DC1 upon a second decoding window F(f+1) following the first window. The memory space Mcv3 is dedicated to storing the first extrinsic variables determined by the decoder DC1 upon processing a third decoding window F(f+2) following the second window. When the first decoding window Ff has been fully processed by the three decoders, the first extrinsic variables relating to processing the first window are erased from the memory space Mcv1. Thus, upon decoding a fourth decoding window F(f+3), the first extrinsic variables determined by the decoder DC1 are stored in the memory space Mcv1 and so on.

The reading by the decoder DC1 of the intrinsic data variables $m^o_{c1}$ to $m^o_{cK}$ stored in the memory space MC and intervening in decoding the window F(f+2) and the writing of likelihood variables $m^i_{c1}$ to $m^i_{cK}$ relating to the end of each iteration i by the decoder DC3 in the memory space MC, could result in an access conflict to the memory space MC. To overcome this problem, a first embodiment consists in using a double port memory enabling variables to be simultaneously read and written, with the provision that the addresses of the variables in the memory space MC are different. This provision is met when the construction rules of the matrix H are satisfied.

Another embodiment consists in using a single port memory and in dividing the memory space MC into two memory banks, a first memory bank storing the intrinsic data variables $m^o_{c1}$ to $m^o_{cK}$, and the second memory bank storing the likelihood variables $m^i_{c1}$ to $m^i_{cK}$.

According to the so-called parallel intra-decoder fourth scheduling, shown in FIG. 13, each decoder simultaneously processes h decoding windows, the factor h being an integer submultiple of the number of decoding windows z cutting off the matrix H, each decoder DC1, DC2 and DC3 in the decoding device DCpia being enabled serially. The fourth scheduling is shown in FIG. 14 according to an example for which $2h = A z$.

The architecture of the decoding device DCpia implementing the fourth scheduling comprises for each decoder DC1, DC2, DC3 of the decoding device DCpia, h subdecoders D11 to D1h, D21 to D2h, D31 to D3h, to simultaneously process the h decoding windows, as shown in FIG. 14.

The parallel intra-decoder scheduling could introduce a decrease in the optimization of the convergence of the decoding algorithm. To ensure a quick convergence, a data variable should not be involved more than once in the group of h×A parity equations. The construction rule of the parity check matrix is then as follows. Two positive permutation coefficients associated with the identity matrices in the same column of index b of the simplified matrix S should have their differences different from $\beta z/h$ modulo z, where z is the size of the identity matrix and $\beta$ is an integer between 1 and h.

This construction rule is expressed by the following relationship:

$$\delta(a,b) \neq (\delta(j,b) + \beta z/h) \bmod z,$$

$\forall$ a$\neq$j such that $1 \leq a \leq A$ and $1 \leq j \leq A$, $\forall$ b such that $1 \leq b \leq B$, and $\forall \beta \in [1, 2, \ldots h]$, in reference to FIG. 2c.

From the different construction rules set out, any scheduling type associated with a decoder architecture can be implemented. For example, a parity check matrix can define an inter-decoder parallel scheduling combined to an intra-decoder parallel scheduling while observing the construction rules associated to both schedulings in order to optimize the convergence of the decoding algorithm and to avoid memory access conflicts.

The invention described herein relates to a determination of a code by means of a construction of a parity check matrix, a encoding and an encoding device for encoding a data signal, a decoding and a decoding device for decoding an encoded data signal. According to one implementation, the steps of the method of the invention are determined by the instructions of computer programs incorporated in the encoding and decoding devices. The programs include program instructions which, when said programs are executed respectively in the encoding device and the encoding device, whose operation is then controlled by executing the programs, perform the steps of the encoding and the encoding embodying the invention.

Consequently the invention also applies to a computer programs, including computer programs stored on or in a storage medium readable by a computer and any data encoding and decoding device, arranged to implement the invention. These programs may be written in any programming language and take the form of source code, object code, or intermediate code between source code and object code, e.g. in a partially compiled form, or any other form suitable for implementing the method of the invention.

The storage medium may be any entity or device capable of storing the program. For example, the medium may comprise a storage arrangement or storage device on which the computer programs of the invention are stored, such as a ROM, for example a CD-ROM or a microelectronic circuit ROM, or USB key, or magnetic storage arrangement, for example a diskette (floppy disk) or hard disk.

Furthermore, the storage medium may be a transmissible medium such as an electrical or optical signal, which may be routed via an electrical or optical cable, by radio or by other arrangements. The programs of the invention may in particular be downloaded over an internet type network.

Alternatively, the storage medium may be an integrated circuit into which the program is incorporated, the circuit being arranged to execute the method of the invention or to be used in the execution of the method embodying the invention.

The invention claimed is:

1. A method of determining a code by constructing a parity check matrix, the method comprising:
   distributing a systematic matrix and a parity matrix, each having rows respectively corresponding to coefficients of parity equation, in decoding windows having a determined size, rows having a given rank in said decoding windows, wherein said rank is successive in said parity check matrix; and
   associating elements of at least one column of said systematic matrix with one of said decoding windows comprising "0s", except for a single one of said elements, which is a "1".

2. The code determining method as claimed in claim 1, wherein said systematic matrix comprises permuted identity matrices have a predetermined size associated with permutation coefficients respectively, and said permutation coefficients associated with said identity matrices in a common column of said systematic matrix are different.

3. The code determining method as claimed in claim 2, wherein said systematic matrix further comprises null square matrices having said predetermined size, each column of said systematic matrix including at least one identity matrix.

4. The code determining method as claimed in claim 1, wherein said systematic matrix comprises permuted identity matrices having a predetermined size associated with permutation coefficients respectively, said permutation coefficients associated with said identity matrices in a common column of said systematic matrix are different, and any two permutation coefficients in a common column have a difference different from 1 modulo the size of a common identity matrices.

5. The code determining method as claimed in claim 1, wherein said systematic matrix comprises permuted identity matrices having a predetermined size associated with permutation coefficients respectively, said permutation coefficients associated with said identity matrices in a common column of said systematic matrix are different, any two permutation coefficients in said common column have a difference different from 1 modulo the size of said identity matrices, and any two permutation coefficients in said common column have a difference different from 2 modulo the size of said identity matrices.

6. The code determining method as claimed in claim 1, wherein said systematic matrix comprises permuted identity matrices having a predetermined size associated with permutation coefficients respectively, and any two permutation coefficients associated with identity matrices in a common column of said systematic matrix have a difference different from $\beta z/h$ modulo z, where h is an integer submultiple of the size z×z of said identity matrices and $\beta$ is an integer lying between 1 and h.

7. The code determining method as claimed in claim 1, wherein said parity matrix comprises identity matrices having a predetermined size and bidiagonally disposed, and a non-circularly permuted identity matrix having said predetermined size.

8. A method of encoding a signal including data variables into a signal including said data variables and parity variables, the method comprising:
   solving parity equations having coefficients which respectively correspond to rows of a parity check matrix comprised of a systematic matrix and a parity matrix; and
   distributing said systematic matrix and parity matrix into decoding windows having a determined size, rows having a given rank in said decoding windows, which are successive in said parity check matrix; and
   associating elements of at least one column of said systematic matrix with one of said decoding windows comprising "0s", except for a single one of said elements which is a "1".

9. A method of decoding an encoded data signal including data variables and parity variables, based on a parity check matrix comprised of a systematic matrix and a parity matrix and having rows which respectively correspond to coefficients of parity equations and are distributed in decoding windows having a determined size, rows having a given rank in said decoding windows being successive in said parity check matrix, said method comprising:
   simultaneous solving parity equations of at least one of said decoding windows, elements of said one decoding window in at least one column of said systematic matrix being "0s", except for a single one of said elements which is a "1", a data variable being only involved in one of said parity equations of said decoding window and not involved in solving parity equations of other decoding windows as long as the solving said parity equations of said one decoding window is not achieved.

10. The decoding method as claimed in claim 9, wherein the data variables which are involved in the parity equations of said one decoding window are each only involved in one of said parity equations of said one decoding window, and are not involved in solving of parity equations of other decoding windows as long as solving of said parity equations of said one decoding window is not achieved.

11. The decoding method as claimed in claim 9, characterized in that it is iterative and comprises processing all said decoding windows for each of a plurality of decoding iterations, and processing a given decoding window comprises:

solving equations of said given decoding window associated with said systematic matrix in order to determine first extrinsic variables as a function of said data variables and second extrinsic variables determined during an iteration preceding said each iteration, and determining first intermediate variables depending on said systematic matrix and said first extrinsic variables being determined;

solving parity equations of said given decoding window associated with said parity matrix as a function of said first intermediate variables and said parity variables in order to obtain second intermediate variables, and solving the parity equations of said given decoding window associated with said systematic matrix to determine second extrinsic variables as a function of said second intermediate variables and said first extrinsic variables, and at each decoding iteration, estimating other data variables as a function of said data variables of said encoded data signal and the determined second extrinsic variables during the processing of all said decoding windows.

12. An encoding device for encoding a signal including data variables into a signal including said data variables and parity variables, the device comprising:

a module for solving parity equations having coefficients which respectively correspond to rows of a parity check matrix comprised of a systematic matrix and a parity matrix and which are distributed in decoding windows having a determined size, rows having a given rank in said decoding windows being successive in the parity check matrix, elements of at least one column of said systematic matrix associated with one of said decoding windows being "0s", except for a single one of said elements which is a "1".

13. A decoding device for decoding a encoded data signal including data variables and parity variables, based on a parity check matrix comprised of a systematic matrix and a parity matrix and having rows which respectively correspond to coefficients of parity equations and which are distributed in decoding windows having a determined size, rows of a given rank in said decoding windows being successive in said parity check matrix, said decoding device comprising:

a module for simultaneously solving parity equations of at least one of said decoding windows having elements "0s" in at least one column of said systematic matrix, except for a single one of said elements which is a "1", a data variable being only involved in one of said parity equations of said one decoding window and not involved in solving parity equations of other decoding windows as long as solving said parity equations of said one decoding window is not achieved.

14. The decoding device as claimed in claim 13, wherein to iteratively process all said decoding windows, said solving arrangement is arranged to execute each of a plurality of decoding iterations and process a given decoding window by including:

an arrangement for solving equations of said given decoding window associated with said systematic matrix in order to determine first extrinsic variables as a function of said data variables and second extrinsic variables determined during an iteration preceding said each iteration, an arrangement for determining first intermediate variables depending on said systematic matrix and said first extrinsic variables being determined, an arrangement for solving parity equations of said given decoding window associated with said parity matrix as a function of said first intermediate variables and said parity variables in order to obtain second intermediate variables, and an arrangement for solving the parity equations of said given decoding window associated with said systematic matrix to determine second extrinsic variables as a function of said second intermediate variables and said first extrinsic variables, and at each decoding iteration, an arrangement for estimating other data variables as a function of the data variables of said encoded data signal and the determined second extrinsic variables during the processing of all said decoding windows.

15. A non-transitory tangible computer-readable medium for storing computer-executable instructions, which when executed by a computer, causes the computer to perform a method of encoding a signal including data variables and parity variables, the method comprising:

solving parity equations, the coefficients of which respectively correspond to the rows of a parity check matrix comprised of a systematic matrix and a parity matrix:

distributing said systematic matrix and parity matrix in decoding windows of the same size, the rows of a same rank in the decoding windows being successive in the parity check matrix, wherein the elements of at least one column of the systematic matrix associated with a decoding window are "0s," except for a single one, which is a "1".

* * * * *